(12) United States Patent
Yan

(10) Patent No.: US 8,745,113 B2
(45) Date of Patent: Jun. 3, 2014

(54) PSEUDO-RANDOM BIT SEQUENCE GENERATOR

(75) Inventor: Junjie Yan, St. John's (CA)

(73) Assignee: Altera Canada Co., Halifax (CA)

( * ) Notice: Subject to any disclaimer, the term of this patent is extended or adjusted under 35 U.S.C. 154(b) by 761 days.

(21) Appl. No.: 12/458,122

(22) Filed: Jul. 1, 2009

(65) Prior Publication Data

US 2010/0287224 A1 Nov. 11, 2010

(30) Foreign Application Priority Data

May 7, 2009 (CA) ..................................... 2664620

(51) Int. Cl.
G06F 7/58 (2006.01)

(52) U.S. Cl.
USPC ............ 708/252; 708/250; 708/253; 708/256

(58) Field of Classification Search
USPC .................................................. 708/252–256
See application file for complete search history.

(56) References Cited

U.S. PATENT DOCUMENTS

| | | |
|---|---|---|
| 3,946,215 A | 3/1976 | May |
| 4,649,419 A | 3/1987 | Arragon et al. |
| 4,713,605 A | 12/1987 | Iyer et al. |
| 4,905,176 A * | 2/1990 | Schulz ............................ 708/252 |
| 4,910,735 A | 3/1990 | Yamashita |
| 5,412,665 A * | 5/1995 | Gruodis et al. ................ 714/739 |
| 5,574,673 A * | 11/1996 | Lowy ............................. 708/250 |
| 5,787,094 A | 7/1998 | Cecchi et al. |
| 5,991,909 A * | 11/1999 | Rajski et al. ................... 714/729 |
| 6,188,714 B1 * | 2/2001 | Yamaguchi ..................... 375/130 |
| 6,240,432 B1 * | 5/2001 | Chuang et al. ................. 708/252 |
| 7,194,496 B2 * | 3/2007 | Morris ........................... 708/250 |
| 7,340,496 B2 * | 3/2008 | Burdine et al. ................ 708/252 |
| 7,421,637 B1 | 9/2008 | Martinez, Jr. et al. |
| 2002/0013797 A1 * | 1/2002 | Jha et al. ........................ 708/250 |
| 2004/0049525 A1 * | 3/2004 | Hars .............................. 708/250 |
| 2004/0220985 A1 * | 11/2004 | Morris ........................... 708/250 |
| 2007/0273408 A1 * | 11/2007 | Golic .............................. 326/93 |

* cited by examiner

Primary Examiner — Chat Do
Assistant Examiner — Jae Jeon
(74) Attorney, Agent, or Firm — Ropes & Gray LLP

(57) ABSTRACT

The present invention discloses a pseudo-random bit sequence (PRBS) generator which outputs the entire datapath, or entire pseudo-random bit sequence, over one single clock cycle. This is accomplished by removing redundancy, or any redundant exclusive-or gates from linear feedback shift registers; using logic to identify the critical path and optimal shift for the critical path; and dividing the datapath into several pipeline stages to increase the clock rate (i.e., transmission speed).

16 Claims, 5 Drawing Sheets

| 3 — | $(x^2 \oplus x^3)$ $\oplus (x^3 \oplus x^4)$ | $x^1 \oplus$ $(x^3 \oplus x^4)$ | $(x^1 \oplus x^2)$ | $(x^2 \oplus x^3)$ | 3e |
|---|---|---|---|---|---|
| | $(x^1 \oplus x^2)$ $\oplus (x^2 \oplus x^3)$ | $(x^2 \oplus x^3)$ $\oplus (x^3 \oplus x^4)$ | $x^1 \oplus$ $(x^3 \oplus x^4)$ | $(x^1 \oplus x^2)$ | 3f |
| | ~~$x^1 \oplus$~~ $(x^3 \oplus x^4)$ ~~$\oplus (x^1 \oplus x^2)$~~ | $(x^1 \oplus x^2)$ $\oplus (x^2 \oplus x^3)$ | $(x^2 \oplus x^3)$ $\oplus (x^3 \oplus x^4)$ | $x^1 \oplus$ $(x^3 \oplus x^4)$ | 3g |

LEGEND
$\oplus$ = XOR 4 bits

FIG. 3

| | | | | |
|---|---|---|---|---|
| 3 — | $(x^2 \oplus x^3)$ $\oplus (x^3 \oplus x^4)$ | $x^1 \oplus$ $(x^3 \oplus x^4)$ | $(x^1 \oplus x^2)$ | $(x^2 \oplus x^3)$ | 3e |
| | $(x^1 \oplus x^2)$ $\oplus (x^2 \oplus x^3)$ | $(x^2 \oplus x^3)$ $\oplus (x^3 \oplus x^4)$ | $x^1 \oplus$ $(x^3 \oplus x^4)$ | $(x^1 \oplus x^2)$ | 3f |
| | ~~$x^1 \oplus$ $(x^3 \oplus x^4)$ $\oplus (x^1 \oplus x^2)$~~ | $(x^1 \oplus x^2)$ $\oplus (x^2 \oplus x^3)$ | $(x^2 \oplus x^3)$ $\oplus (x^3 \oplus x^4)$ | $x^1 \oplus$ $(x^3 \oplus x^4)$ | 3g |

LEGEND
$\oplus$ = XOR

PSEUDO-RANDOM BIT SEQUENCE GENERATOR

CROSS-REFERENCE TO RELATED APPLICATIONS

Claims priority to Canadian Application No. 2,664,620, "Pseudo-Random Bit Sequence Generator," originally filed May 7, 2009.

STATEMENT REGARDING FEDERALLY SPONSORED RESEARCH OR DEVELOPMENT

N/A

REFERENCE TO A SEQUENCE LISTING, A TABLE, OR A COMPUTER PROGRAM LISTING COMPACT DISC APPENDIX

N/A

BACKGROUND OF THE INVENTION

1. Technical Field of the Invention

The present invention relates to the generation of Pseudo-Random Bit Sequences (PRBS).

2. Background of the Invention

The present invention discloses a method of generating a Pseudo-Random Bit Sequence (PRBS). The utility of such random numbers includes the creation of cryptography keys, the generation of bit stream ciphers and hash functions, and the testing of circuits and circuit simulations to detect and correct design errors.

A PRBS Generator is typically based on a Linear Feedback Shift Register (LFSR). An LFSR consists of a series of flip-flops connected by Exclusive-Or (XOR) gates, allowing for the output of one or more flip-flops to be input into a subsequent flip-flop. The PRBS Generator will cycle one bit location, or stage, to be output from the LFSR over each clock cycle or period, until each of bit locations 1 to n (where n=datapath width) is output and fed back into the first bit location. Because LFSRs vary in size (4-bits, 16-bits, 64-bits, etc), they will repeat themselves once each bit location or stage is fed back and input into the first bit location. FIG. 1 illustrates a prior art example, where a four-bit LFSR (3) receives input data (1) and cyclically shifts the data by outputting the information from the third bit location (6) and fourth bit location (7), XORing the data together, and creating a new state to be fed back into the first bit location (4). Therefore, in a four-bit LFSR, for each bit to be output from each bit location requires 4 clock periods, where one bit is output each cycle. The input bit is therefore a result of a linear function of the present state LFSR (the XORing of bits from the LFSR), with next state data shifting cyclically through the circuit through a feedback loop to generate a pseudo-random output (2). The LFSR generates a PRBS pattern, which may appear to be truly random but is actually pseudo random due to the deterministic nature of computer-based operations: each of the values produced by the LFSR are determined by the present and next states and because the LFSR is deterministic, the present state can be used to predict the next state.

A four-bit, PRBS Generating LFSR can be represented by the polynomial 1+x3+x4, where each clock cycle or period outputs one bit, and the four bit locations (or taps) of the LFSR are x1, x2, x3 and x4. In the first clock cycle, the latter two bit locations of the present state, x3 and x4, are XORed together and fed back into the first bit location, x1, so the new value (x3 XOR x4) is located in the first bit location and the x1 value is shifted into the second bit location (formerly x2). As illustrated in FIG. 2, as the circuit continues to XOR the last two bit locations and shift the new values back, the following feedbacks to the first bit location or stage occur:

Feedback [1]=x3 XOR x4
Feedback [2]=x2 XOR x3
Feedback [3]=x1 XOR x2
Feedback [4]=x1 XOR (x3 XOR x4)

After four full clock cycles, the value of the first bit location is (x1 XOR (x3 XOR x4)); the second bit location is (x1 XOR x2); the third bit location is (x2 XOR x3); and the fourth bit location is (x3 XOR x4). The LFSR then repeats itself and continues to shift data through the circuit to generate a PRBS pattern.

Several problems exist with this method of using LFSRs to generate PRBS patterns. First, there is a large amount of latency produced where the LFSR can only output one bit per clock cycle: to output 4 bits from a 4 bit LFSR requires 4 clock cycles; to output 16 bits from a 16 bit LFSR requires 16 clock cycles; etc. The speed of the output also depends on the number of XOR gates the data must travel through; the larger the size of the LFSR, the larger the size of the logic element required to accommodate it, and the larger the number of XOR gates needed.

SUMMARY OF THE INVENTION

When producing a Pseudo-Random Bit Sequence (PRBS) with a Linear Feedback Shift Register (LFSR), latency may be reduced by outputting the entire datapath over one single clock cycle. Typically, an n-bit LFSR has n data bits in bit locations 1-n and 1 bit is output from the datapath each clock cycle. Therefore, after n clock cycles or periods, an n-bit PRBS pattern has been output. However, the present invention discloses a method to reduce the latency of PRBS Generation by (1) removing redundancy, or redundant XOR gates; (2) employing foresee logic to identify the critical path and optimal shift for the critical path; and (3) dividing the datapath into several pipeline stages to increase the clock rate, thereby outputting the entire datapath in one clock cycle.

DESCRIPTION OF THE DRAWINGS

FIG. 3 is a block diagram illustrating the present invention's improvement upon the LFSR (3) of FIG. 2.

DETAILED DESCRIPTION OF THE INVENTION

The present invention aims to reduce the latency associated with Pseudo-Random Bit Sequence (PRBS) Generation by outputting an entire datapath in one clock cycle or period, as opposed to the prior art practice of outputting one single bit in one clock cycle or period. This would imply that for an n-bit LFSR, the datapath would shift n times each clock cycle to output the entire n-bit datapath. However, the present invention employs a combinational logic element to foresee the next state, eliminating any wait time associated with the n-bit datapath shift.

Figure 1:
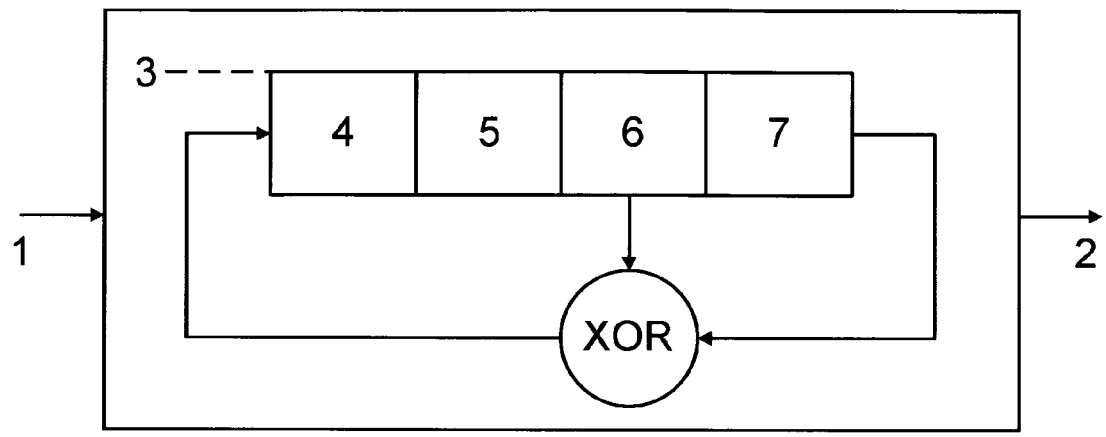
FIG. 1 is a block diagram illustrating a prior art example of a four-bit Linear Feedback Shift Register (LFSR).
Figure 4:
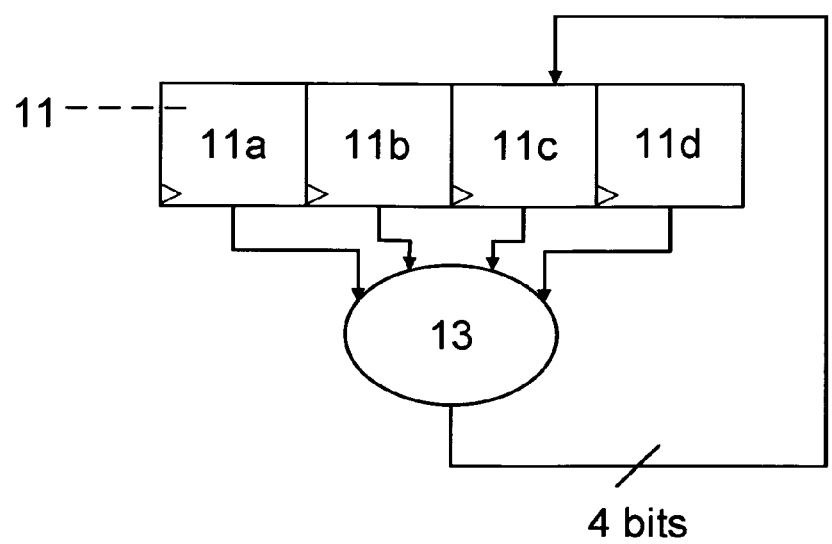
FIG. 4 is a block diagram illustrating a simplified view of an illustrative embodiment of the present invention.

As illustrated in FIG. 4, a present state value exists in a Linear Feedback Shift Register (11). It should be noted that the 4-bit LFSR (11) is illustrated for demonstrative purposes only and should not be considered to limit the scope of the invention, as the invention may be applicable to any size LFSR. The LFSR (11), instead of XORing data from the final two bit locations (11c, 11d) and feeding back the new value to the first bit location (11a), as shown in the prior art example of FIG. 1, instead transmits the data from LFSR (11) into a combinational logic (13), which determines the next state, or the next bit shift, without LFSR (11) actually shifting the data. Note that this combinational logic (13) has no register and therefore is not controlled by a clock. The next state as determined by combinational logic (13) is then fed back to LFSR (11) as the new present state. The ability of the combinational logic (13) to foresee or calculate the next state and feed the value back to the original LFSR (11) as the new present state eliminates the need to output all n-bits from the datapath by shifting all n-bits in the LFSR (11), which is critical in reducing the PRBS Generation latency.

In addition to providing the ability to foresee the next state, the combinational logic element also provides the ability to identify the critical path. It should be noted that the term "critical path" typically refers to the longest path for the data to travel between registers, based upon the number of XOR gates and the length of the datapath route. However, for illustrative purposes, the present invention employs the term "critical path" to refer to the maximum number of XOR gates between registers, and does not refer to the length of the datapath route. The critical path is important as it acts as the signal which determines the overall frequency of the PRBS Generator. The speed of the PRBS Generator depends on the number of XOR gates the critical path must travel through, so to minimize latency you must minimize the number of XOR gates. In an n-bit LFSR, n is the size of the datapath and therefore n-bit shifts results in the highest amount of XOR gates. The latency of the PRBS Generator can be reduced by removing redundancy (i.e., removing all even-numbered XOR gates and removing all but one odd-numbered XOR gates) and therefore determining the smallest bit-shift for the critical path.

Figure 2:
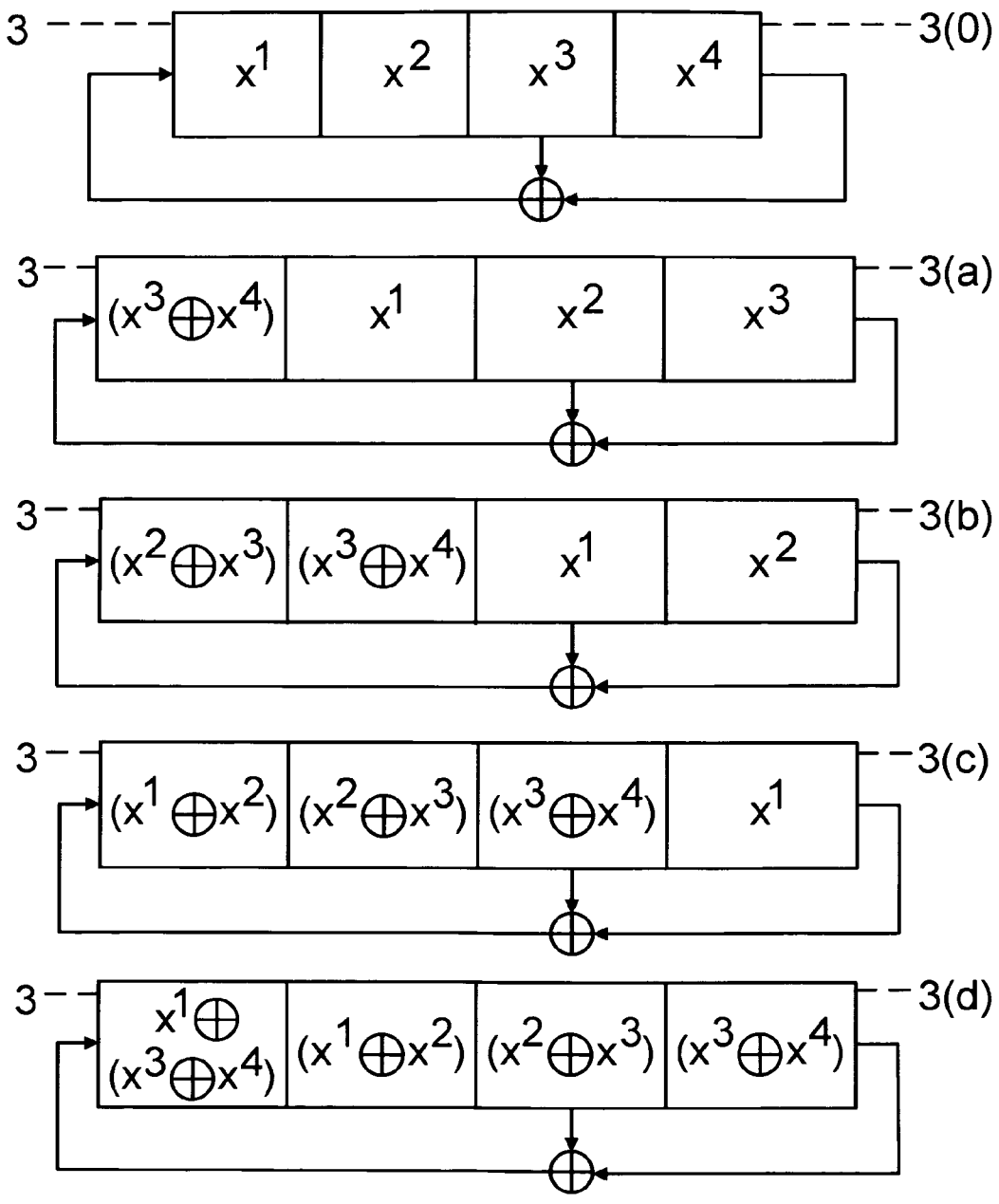
FIG. 2 is a block diagram illustrating a prior art example of a four-bit Linear Feedback Shift Register (LFSR).

FIG. 3 is provided as an illustrative example of the removal of redundancy within the prior art 4-bit LFSR (3) illustrated in FIG. 2. As illustrated in FIG. 3, when 4 bit locations, x1, x2, x3 and x4 are repeatedly shifted, the maximum number of XOR gates is 3, as found in the first bit location of the fifth bit shift (3e). After the seventh shift (3g) we see a total of 4 XOR gates in the first bit location, but the redundant even-numbered values cancel each other out to leave only 2 XOR gates remaining in the first bit location. Therefore, the smallest and most efficient shift for the critical path is 3. This number is identified through the use of software or another hardware platform which removes redundancy by removing all even-numbered XOR gates and removing all but one odd-numbered XOR gates, and subsequently identifies the critical path, as, again, the maximum number of XOR gates between registers. The software (or other hardware platform) then iterates through all possible bit shifts to determine the optimal bit-shift for the critical path.

Figure 5:
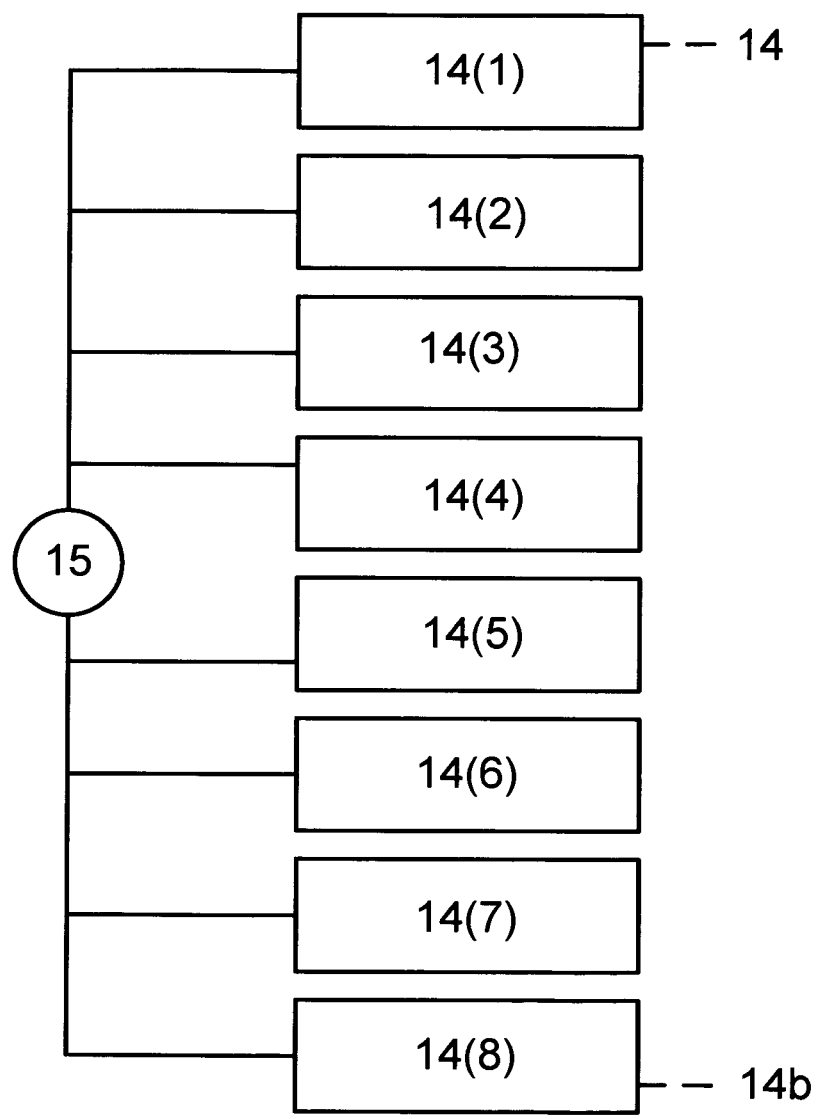
FIG. 5 is a block diagram illustrating a simplified view of an illustrative embodiment of the present invention.

The size of the combinational logic (13) used to determine the next state is directly correlated to the size of the LFSR and therefore the size of the datapath. For example, a 4-bit LFSR will necessitate a 4-bit combinational logic element, a 16-bit LFSR will necessitate a 16-bit combinational logic element; a 64-bit LFSR will necessitate a 64-bit combinational logic element, etc. Therefore, both the combinational logic and the critical path may be too large. To reduce the size and latency of the PRBS Generator, the datapath may be reduced by splitting it into several pieces, or pipeline stages. The pipeline consists of multiple blocks connected as a series, where the data output from one pipeline stage is input into a next pipeline stage. As illustrated in FIG. 5, the datapath is broken into a number of pipeline stages, 1-b, where b=total number of pipeline stages, (14(1)-14(8)), and the registers within each stage are initialized by a seed (m) value, where m≠0 (15), which indicates to each LFSR the number of bits to shift out for each clock cycle or period. When two or more LFSRs are arranged in pipeline stages (b), and each clock cycle or period outputs a number of bits from each pipeline stage (b) which are then concatenated as the total output, the latency of the PRBS Generator is reduced.

DETAILED DESCRIPTION OF AN ILLUSTRATIVE EMBODIMENT OF THE INVENTION

In an illustrative embodiment of the present invention, PRBS Generation occurs over a 256-bit OTU3 datapath, where software or another hardware platform is used to remove redundancy by removing all even-numbered XOR gates and removing all but one odd-numbered XOR gates, subsequently identifying the critical path, and the software (or other hardware platform) then iterates through all possible bit-shifts to identify the optimal shift for the critical path. For a 256-bit OTU3 datapath, the critical path is 32 bits (as described above). A 256 bit datapath with a 32 bit critical path requires 8 pipeline stages (256÷32=8).

In the illustrative embodiment of the present invention, PRBS Generation consists of two phases; the "initialization phase" and the "normal phase." As illustrated in FIG. 5, "initialization phase" occurs when a seed (m) value (15), is issued to initialize the PRBS generator by signaling the data shift in each of the b pipeline stages (14(1)-14(8)). The contents of each pipeline stage are expanded in FIG. 6, where block (14(1)) and block (14(2)) each represent a pipeline stage (b).

Figure 6:
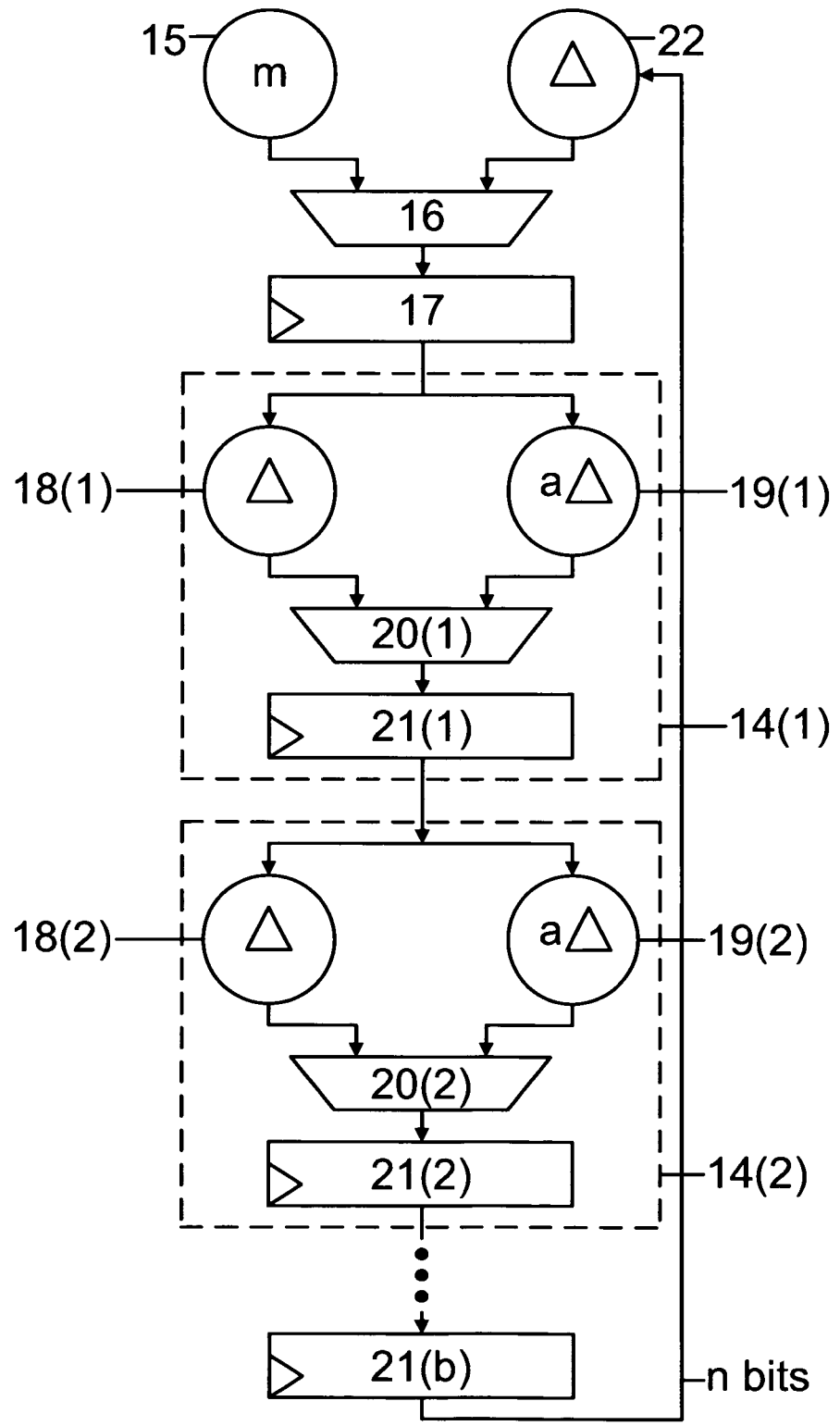
FIG. 6 is a block diagram illustrating an illustrative embodiment of the invention.

As shown in FIG. 6, in initialization phase, the seed (m) value (15) is input into multiplexer (16) and into a first register (17) which outputs the value into a first pipeline stage (14(1)). In the first pipeline stage (14(1)), multiplexer (20(1)) selects the initialization input from combinational logic element Δ (18(1)) and loads this value into the first pipeline stage register (21(1)). The value of combinational logic element Δ (18(1)), specified by seed (m), indicates the amount of data needed to shift per pipeline stage. From register (21(1)) the data is fed into the next pipeline stage (14(2)) where the data in register (21(2)) is similarly shifted. This process is repeated until the value reaches the final register (21(b)), whereby the value, or the next state, is fed back to the first register (17) as the new present state.

Once the new present state is fed back to the first register (17) via combinational logic element Δ (22) and multiplexer (16), the PRBS Generation has entered "normal phase." In the first pipeline stage (14(1)), multiplexer (20(1)) now selects the normal phase input from combinational logic element aΔ (19(1)) and loads this value into the first pipeline stage register (21(1)) (as opposed to multiplexer (20(1)) selecting the initialization input from combinational logic element Δ (18 (1)) as in the "initialization phase"). The value of combinational logic element aΔ (19(1)), specifies the new amount of data needed to shift per pipeline stage. As in initialization phase, from register (21(1)) the data is fed into the next pipeline stage (14(2)) where the data in register (21(2)) is similarly shifted. The process is repeated until the value reaches the final register (21(b)), and the value, or the next state, is again fed back to the first register (17) as the new present state. This process is repeated in "normal phase" for a total of b clock cycles or periods, as the number of clock cycles or periods needed to output the full datapath is equivalent to the number of pipeline stages (b).

In this illustrative embodiment of the present invention, each pipeline stage (b) register (21(1-b)) represents the logic shifted by the previous stages, so the first register (21(1)) outputs data into a second register (21(2)) and shifts the data in the second register (21(2)) by 32 bits; the second register (21(2)) outputs data into a third register (21(3)) (not shown) and shifts the data in the third register (21(3)) by 32 bits; this continues until the second-to-last register (21(b−1)) outputs data into a final register (21(b)) and shifts the data in the final register (21(b)) by 32 bits. In the illustrative embodiment of the present invention, the data shift output over each clock cycle equals 32 bits per pipeline stage, with 8 pipeline stages, which when concatenated produces the first full 256-bit datapath. In "normal phase," PRBS Generation works continuously, producing PRBS patterns each clock cycle; there is no wait time associated as in the "initialization phase."

In the illustrative embodiment of the invention, the PRBS Generator is comprised of two main types of combinational logic elements, $\Delta$ and a$\Delta$, which determine the critical path. Where the datapath is n=256 bits, software or another hardware platform can be used to calculate the longest path and the number of XOR gates for each signal by allowing a=1, a=2, a=3, etc., until a=128, or ½ n as the last divider. The flexibility of up to 128 options allows for the most optimal path to be chosen.

A number of equations to identify the critical path can be determined. Where, n=datapath
b=number of pipeline stages
$\Delta$=shift x bits combinational logic
a$\Delta$=shift (a*x) bits combinational logic
And the critical path is the path of $\Delta$ if it is longer than the path of a$\Delta$, or the critical path is the path of a$\Delta$ if it is longer than the path of $\Delta$, i.e.,
critical path=max ($\Delta$, a$\Delta$)
Then:

$n=(x*b)$

OR $a=(n\div b)+1$

In normal mode, x bits are output from each register at every clock cycle: the concatenation of these bits generates the n-bit PRBS pattern.

I claim:

1. A pseudo-random bit sequence generator, comprising:
   (a) a datapath comprising n-bits, wherein said datapath is divided into a plurality of independent datapath stages, each of said plurality of independent datapath stages comprising b-bits,
   (b) a plurality of linear feedback shift registers, each of said plurality of linear feedback shift registers comprising a plurality of flip-flops serially connected via a corresponding plurality of exclusive-or gates;
   (c) a plurality of combinational logic elements, wherein a plurality of present state data values from the plurality of linear feedback shift registers is input into the plurality of combinational logic elements, and whereby the plurality of combinational logic elements determines a plurality of next state data values and provides, during a single clock cycle, the plurality of next state data values to the plurality of said linear feedback shift registers as a plurality of new present state data values;
   (d) a deterministic logic element, wherein said deterministic logic element is configured to:
   identify a number of redundant exclusive-or gates from said plurality of exclusive-or gates;
   remove said number of redundant exclusive-or gates by removing all even-numbered redundant exclusive-or gates from said plurality of exclusive-or gates or removing all-but-one odd-numbered redundant exclusive-or gates from said plurality of exclusive-or gates, thereby identifying a largest number of said plurality of exclusive-or gates for data to travel through;
   determine an optimal bit-shift, wherein said optimal bit-shift is equivalent to the maximum number of said plurality of exclusive-or gates after said deterministic logic element has removed said number of redundant exclusive-or gates from said plurality of exclusive-or gates; and
   generate a pseudo-random bit sequence when each of the plurality of linear feedback shift registers outputs one or more respective b-bits.

2. The pseudo-random bit sequence generator of claim 1, wherein at least one the plurality of independent datapath stages is a pipeline stage.

3. The pseudo-random bit sequence generator of claim 1, wherein said deterministic logic element is a software element.

4. The pseudo-random bit sequence generator of claim 1, wherein said deterministic logic element is a hardware platform.

5. A method for generating a pseudo-random bit sequence using a datapath comprising n-bits, wherein said datapath is divided into a plurality of independent datapath stages, each of said plurality of independent datapath stages comprising b-bits, the method comprising:
   inputting a plurality of present state data values from a plurality of linear feedback shift registers into a plurality of combinational logic elements, wherein each of said plurality of linear feedback shift registers comprises a plurality of flip-flops serially connected via a corresponding plurality of exclusive-or gates;
   determining using the plurality of combinational logic elements a plurality of next state data values and providing, during a single clock cycle, the plurality of next state data values to the plurality of said linear feedback shift registers as a plurality of new present state data values;
   identifying, using a deterministic logic element, a number of redundant exclusive-or gates from said plurality of exclusive-or gates;
   removing, using the deterministic logic element, said number of redundant exclusive-or gates by removing all even-numbered redundant exclusive-or gates from said plurality of exclusive-or gates or removing all-but-one odd-numbered redundant exclusive- or gates from said plurality of exclusive-or gates, thereby identifying a largest number of said plurality of exclusive-or gates for data to travel through;
   determining, using the deterministic logic element, an optimal bit-shift, wherein said optimal bit-shift is equivalent to the maximum number of said plurality of exclusive-or gates after said deterministic logic element has removed said number of redundant exclusive-or gates from said plurality of exclusive-or gates; and generating, using the deterministic logic element, a pseudo-random bit sequence when each of the plurality of linear feedback shift registers outputs one or more respective b-bits.

6. The method of claim 5, wherein at least one the plurality of independent datapath stages is a pipeline stage.

7. The method of claim 5, wherein said deterministic logic element is a software element.

8. The method of claim 5, wherein said deterministic logic element is a hardware platform.

9. The method of claim 5, wherein the plurality of combinational logic elements are configured for receiving the input plurality of present state data values, and wherein said receiving, said determining the plurality of next state data values, and said providing the plurality of next state data values are performed in an amount of time that is less than a period of a clock of the plurality of linear feedback shift registers.

10. The method of claim 5, wherein the plurality of combinational logic elements are configured to receive the input plurality of present state data values, and perform said determining the plurality of next state data values and said providing the plurality of next state data values without a clock input.

11. Pseudo-random bit sequence generation circuitry comprising:
(a) a datapath comprising n-bits, wherein said datapath is divided into a plurality of independent datapath stages, each of said plurality of independent datapath stages comprising b-bits,
(b) linear feedback shift register circuitry comprising flip-flops serially connected via a corresponding plurality of exclusive-or gates;
(c) combinational logic circuitry, wherein a plurality of present state data values from the linear feedback shift register circuitry is input into the combinational logic circuitry, and whereby the combinational logic circuitry determines a plurality of next state data values and provides, during a single clock cycle, the plurality of next state data values to the linear feedback shift register circuitry as a plurality of new present state data values;
(d) deterministic logic circuitry configured to:
identify a number of redundant exclusive-or gates from said plurality of exclusive-or gates;
remove said number of redundant exclusive-or gates by removing all even-numbered redundant exclusive-or gates from said plurality of exclusive-or gates or removing all-but-one odd-numbered redundant exclusive-or gates from said plurality of exclusive-or gates, thereby identifying a largest number of said plurality of exclusive-or gates for data to travel through;
determine an optimal bit-shift, wherein said optimal bit-shift is equivalent to the maximum number of said plurality of exclusive-or gates after said deterministic logic element has removed said number of redundant exclusive-or gates from said plurality of exclusive-or gates; and
generate a pseudo-random bit sequence when the linear feedback shift register circuitry outputs one or more respective b-bits.

12. The pseudo-random bit sequence generation circuitry of claim 11, wherein at least one the plurality of independent datapath stages is a pipeline stage.

13. The pseudo-random bit sequence generation circuitry of claim 11, wherein said deterministic logic circuitry comprises a software element.

14. The pseudo-random bit sequence generation circuitry of claim 11, wherein said deterministic logic circuitry is a hardware platform.

15. The pseudo-random bit sequence generation circuitry of claim 11, wherein the combinational logic circuitry is configured for receiving the input plurality of present state data values, and wherein said receiving, said determining the plurality of next state data values, and said providing the plurality of next state data values are performed in an amount of time that is less than a period of a clock of the plurality of linear feedback shift registers.

16. The pseudo-random bit sequence generation circuitry of claim 11, wherein the combinational logic circuitry is configured to receive the input plurality of present state data values, and perform said determining the plurality of next state data values and said providing the plurality of next state data values without a clock input.

\* \* \* \* \*